(12) United States Patent
Hsiao et al.

(10) Patent No.: US 9,017,023 B2
(45) Date of Patent: Apr. 28, 2015

(54) FAN STRUCTURE AND ELECTRONIC DEVICE APPLIED WITH THE SAME

(75) Inventors: Fei-Kai Hsiao, Taipei (TW); Te-Chuan Wang, Taipei (TW); Ting-Chiang Huang, Taipei (TW)

(73) Assignee: Inventec Corporation, Taipei (TW)

( * ) Notice: Subject to any disclaimer, the term of this patent is extended or adjusted under 35 U.S.C. 154(b) by 535 days.

(21) Appl. No.: 13/361,413

(22) Filed: Jan. 30, 2012

(65) Prior Publication Data

US 2013/0077242 A1 Mar. 28, 2013

(30) Foreign Application Priority Data

Sep. 23, 2011 (TW) .............................. 100134466 A

(51) Int. Cl.
| | |
|---|---|
| F04D 29/64 | (2006.01) |
| G06F 1/20 | (2006.01) |
| F04D 29/42 | (2006.01) |
| F04D 29/52 | (2006.01) |
| H05K 7/20 | (2006.01) |
| F04D 17/16 | (2006.01) |
| F04D 25/06 | (2006.01) |
| F04D 29/60 | (2006.01) |
| H01L 23/427 | (2006.01) |

(52) U.S. Cl.
CPC ............ *G06F 1/203* (2013.01); *F04D 29/4226* (2013.01); *F04D 29/522* (2013.01); *H01L 23/427* (2013.01); *H05K 7/20172* (2013.01); *F04D 17/16* (2013.01); *F04D 25/0613* (2013.01); *F04D 29/601* (2013.01); *H01L 2924/0002* (2013.01)

(58) Field of Classification Search
CPC .. F04D 29/403; F04D 29/4226; F04D 29/522
USPC ............... 415/213.1, 201; 411/173, 174, 175; 361/695, 697
See application file for complete search history.

(56) References Cited

U.S. PATENT DOCUMENTS

| | | | | |
|---|---|---|---|---|
| 5,713,790 | A * | 2/1998 | Lin | 454/184 |
| 6,074,296 | A * | 6/2000 | Wu | 454/184 |
| 6,754,077 | B2 * | 6/2004 | Lo et al. | 361/700 |
| 7,697,288 | B2 * | 4/2010 | Okutsu | 361/695 |
| 8,363,400 | B2 * | 1/2013 | Wang et al. | 361/695 |
| 2010/0053893 | A1 * | 3/2010 | Willis et al. | 361/695 |

* cited by examiner

*Primary Examiner* — Ninh H Nguyen
(74) *Attorney, Agent, or Firm* — Maschoff Brennan

(57) ABSTRACT

An electronic device comprises a back plate, a fan and a coupling element. The fan includes a supporting base, a cover and a fan blade. The cover is disposed on the supporting base to form a fan blade accommodating space, the fan blade is disposed inside the accommodating space and is pivotally connected to the supporting base. In addition, the supporting base includes a coupling hole which is disposed inside the accommodating space. The coupling element passes through the coupling hole in order to have the supporting base installed on the back plate. Whereby, a bottom area of the fan is reduced by having both the coupling hole and the fan blade disposed inside the accommodating space, so that less space of circuit layout for a circuit board is occupied by the fan.

9 Claims, 9 Drawing Sheets

FAN STRUCTURE AND ELECTRONIC DEVICE APPLIED WITH THE SAME

CROSS-REFERENCE TO RELATED APPLICATIONS

This non-provisional application claims priority under 35 U.S.C. §119(a) on Patent Application No(s). 100134466 filed in Taiwan, R.O.C. on Sep. 23, 2011, the entire contents of which are hereby incorporated by reference.

BACKGROUND

1. Technical Field

The present disclosure relates to an electronic device and more particularly to an electronic device with which more space is provided for circuit layout of a circuit board.

2. Related Art

A fan is commonly used to be disposed inside electronic devices for heat dissipation. When a fan is operated, cool air from an external surrounding is introduced by the fan into an electronic device, thus heat exchange occurs between the cool air introduced into the electronic device and heat energy produced by electronic elements of the device. After heat exchange, the cool air is discharged to the external surrounding through an outlet of the electronic device.

Even though a fan can be used for heat dissipation of electronic devices, it has a disadvantage of occupying a space of circuit layout for a circuit board. The reason is as follows, in the past, screws are used for coupling a fan on an electronic device; when the fan is under operation, in order that airflow is not hindered by a locking portion between the fan and the electronic device, the locking portion is usually disposed outside a flow passage of the fan. Therefore, the locking portion is pressed on the circuit board with which a space of circuit layout for the circuit board is occupied. Especially with a trend that existing electronic mobile devices are getting smaller and slimmer, the space of circuit layout provided by the circuit board for a layout technician is even more limited. On top of this problem, if the space of circuit layout for the circuit board is further occupied by the coupling portion between the fan and the electronic device, it is rather troublesome for the circuit layout technician.

Therefore, when the fan is coupled with the electronic device, how the space of circuit layout for the circuit board can be prevented from occupying by the coupling portion between the fan and the electronic device is a problem designers have to tackle.

SUMMARY

The present disclosure relates to an electronic device for tackling the problem in existing technology, that when the fan is coupled with the electronic device, the space of circuit layout for the circuit board is occupied by the coupling portion between the fan and the electronic device.

An embodiment of the present disclosure discloses an electronic device which comprises a back plate, a fan and a coupling element. The fan is disposed on the back plate and includes a supporting base, a cover and a fan blade. The supporting base includes a coupling hole, a first surface and a surrounding wall erected on the first surface, the coupling hole is disposed on the first surface and is surrounded by the surrounding wall, and the coupling element passes through the coupling hole in order to have the supporting base installed on the back plate. The cover is disposed on the surrounding wall; the supporting base, the cover and the surrounding wall together form a fan blade accommodating space. The fan blade is pivotally connected to the supporting base and is disposed inside the accommodating space.

An embodiment of the present disclosure discloses a fan structure which is applicable to be disposed on a back plate by using a coupling element. The fan structure includes a supporting base, a cover and a fan blade. The supporting base includes a coupling hole, a first surface and a surrounding wall erected on the first surface, the coupling hole is disposed on the first surface and is surrounded by the surrounding wall, and the coupling element is applicable to pass through the coupling hole in order to have the supporting base installed on the back plate. The cover is disposed on the surrounding wall; the supporting base, the cover and the surrounding wall together form a fan blade accommodating space. The fan blade is pivotally connected to the supporting base and is disposed inside the accommodating space.

The electronic device disclosed in the abovementioned embodiment of the present disclosure, with a disposing position of the coupling hole being moved inside an area surrounded by the surrounding wall instead of locating outside the area surrounded by the surrounding wall. Therefore, a bottom area of the fan can be reduced effectively, so that a space of the electronic device occupied by the fan is reduced, without having the space of circuit layout for the circuit board occupied.

The structure and the technical means adopted by the present disclosure to achieve the above and other objects can be best understood by referring to the following detailed description of the preferred embodiments and the accompanying drawings.

DETAILED DESCRIPTION

Figure 1:
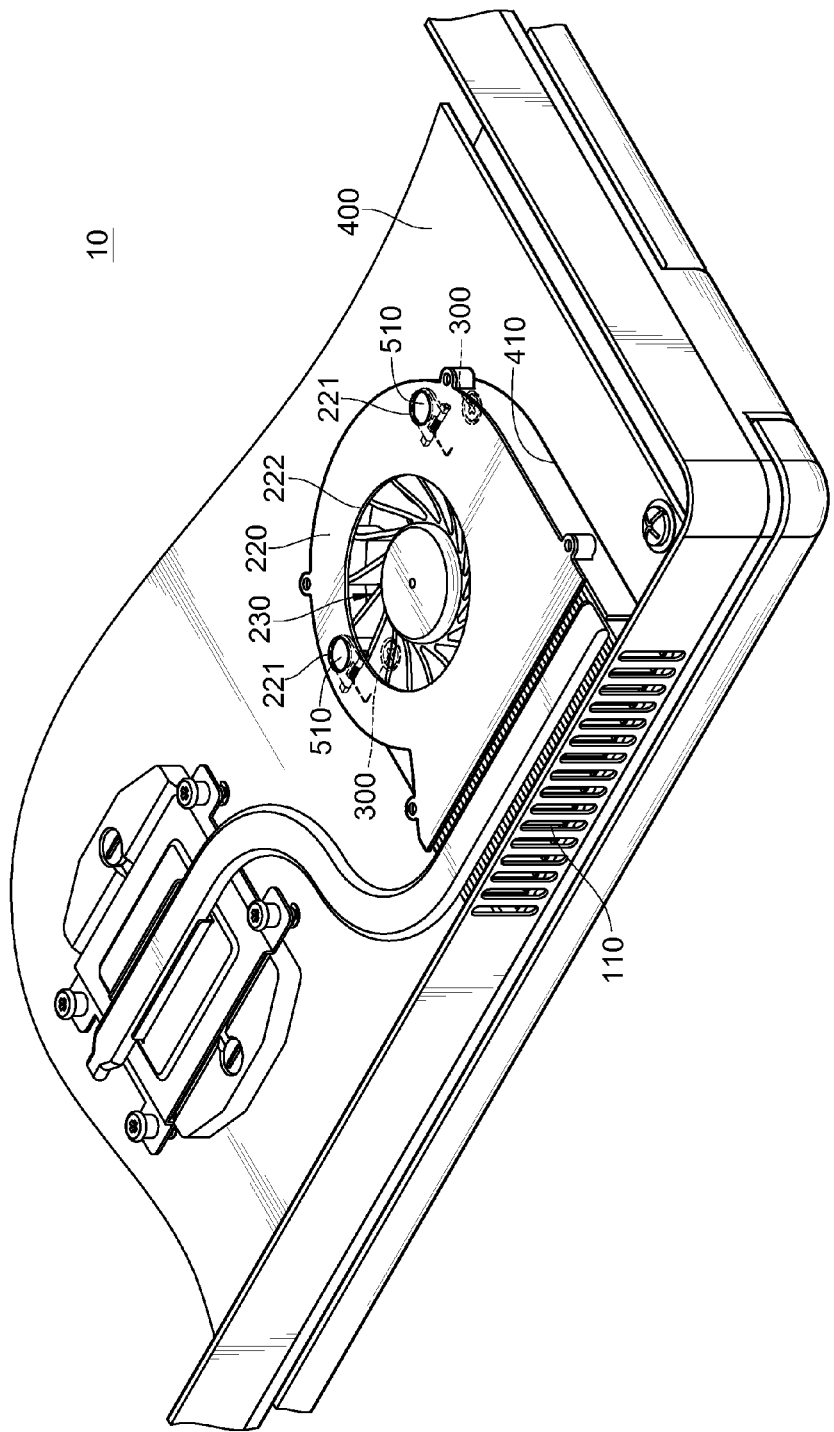
FIG. 1 is a perspective view of a first embodiment of an electronic device of the present disclosure.
Figure 2:
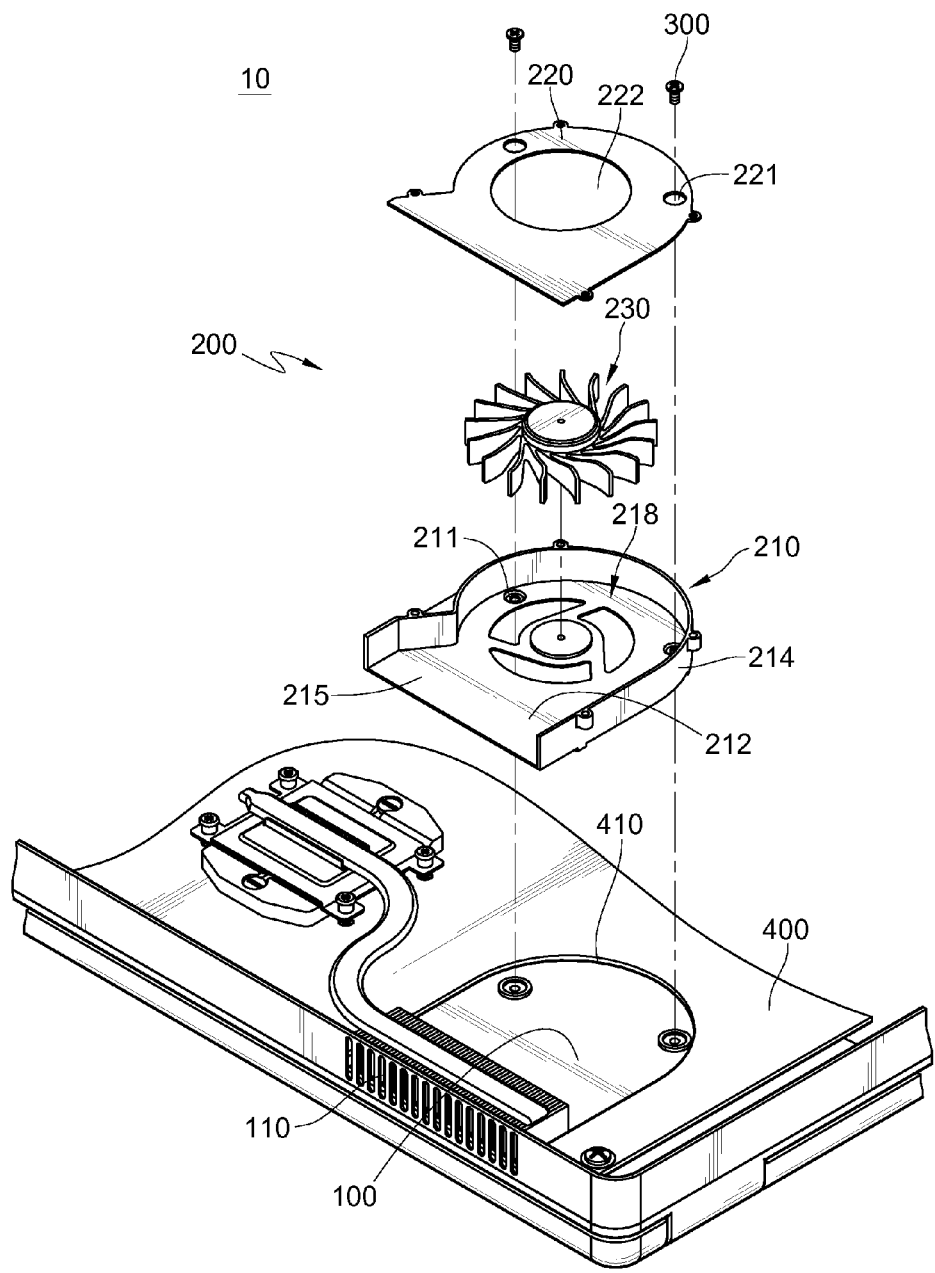
FIG. 2 is an exploded perspective view of FIG. 1.

Referring to FIGS. 1 and 2, FIG. 1 is a perspective view of a first embodiment of an electronic device of the present disclosure, while FIG. 2 is an exploded perspective view of FIG. 1. An electronic device 10 can be a desktop computer, a laptop, a server or a tablet computer, but not as a limitation. A laptop is used in the present embodiment but not as a limitation thereof.

The present embodiment of the electronic device 10 comprises a back plate 100, a fan 200 and a coupling element 300. The back plate 100 for example, is a part of a bottom case of the electronic device 10, and a plurality of vent holes 110 is disposed on one side of the back plate 100. A circuit board 400 is disposed on the back plate 100, and the circuit board 400 has an opening 410 disposed in corresponding to the vent holes 110. The opening 410 is for accommodating the fan 200, therefore, a shape of the opening 410 is matched with that of the fan 200, so that the fan 200 can be directly locked and fixed on the back plate 100.

The fan 200 includes a supporting base 210 and a cover 220. The supporting base 210 includes a coupling hole 211, a first surface 212 and a surrounding wall 214 erected on the first surface 212. The coupling hole 211 passes through the supporting base 210 and is disposed on the first surface 212. Furthermore, the coupling hole 211 is surrounded by the surrounding wall 214. In other words, the coupling hole 211 is located in an area surrounded by the surrounding wall 214; so that a problem that a bottom area of the fan 200 is enlarged because the coupling hole 211 is located outside the area surrounding by the surrounding wall 214, can be avoided. Therefore, an area of the electronic device 10 occupied by the fan 200 can be reduced.

Furthermore, the coupling hole 211 can be surrounded by the surrounding wall 214 in such a way that two ends of the surrounding wall 214 are connected with each other to form an O-shape as viewed from top looking down at the surrounding wall 214; the coupling hole 211 can also be surrounded by the surrounding wall 214 in such a way that two ends of the surrounding wall 214 are not connected to each other to form a C-shape as viewed from top looking down at the surrounding wall 214, as shown in FIG. 2.

The cover 220 is disposed on the surrounding wall 214, in other words, the surrounding wall 214 is covered by the cover 220, so that a fan blade accommodating space 218 is formed between the supporting base 210 and the cover 220. Additionally, an air inlet 222 is disposed on the cover 220, and an air outlet 215 is formed by the cover 220 and the supporting base 210.

A fan blade 230 is pivotally connected to the supporting base 210 and disposed inside the accommodating space 218. The fan blade 230 rotates in corresponding to the supporting base 210 to produce a forced air current. The forced air current is flowed in from the air inlet 222, and passed through the accommodating space 218, then discharged from the air outlet 215 and the vent holes 110.

Figure 3:
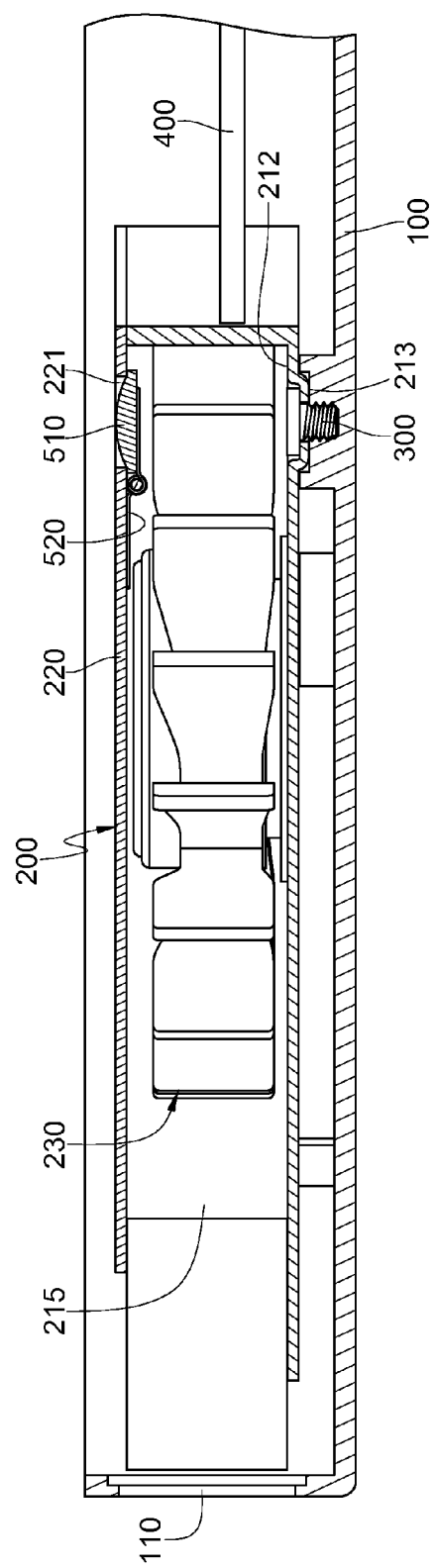
FIG. 3 is a cross-sectional view of FIG. 1.
Figure 4A:
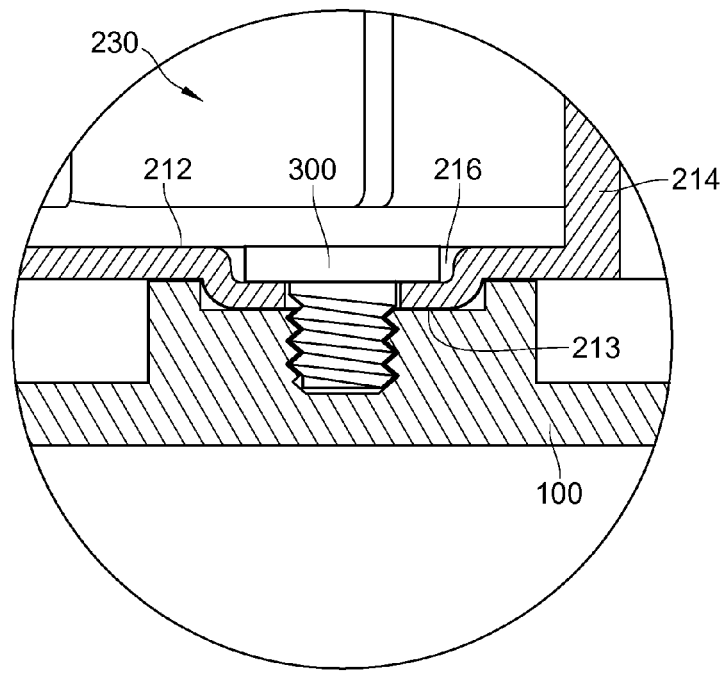
FIG. 4A is a partial enlarged view of FIG. 3.
Figure 4B:
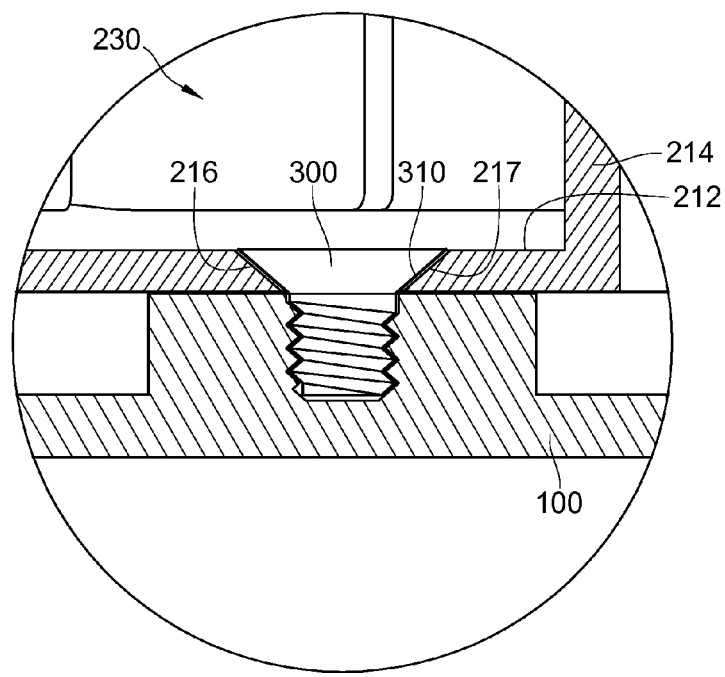
FIG. 4B is cross-sectional view of a second embodiment of a supporting base being installed on a back plate by a coupling element.

The coupling element 300 passes through the coupling hole 211 in order to have the supporting base 210 installed on the back plate 100. In addition, the coupling hole 211 has a recess 216 disposed on the first surface 212, so that when the supporting base 210 is installed on the back plate 100 by the coupling element 300, the coupling element 300 can be disposed in the recess 216. More specifically, please refer to FIGS. 3 to 4B, FIG. 3 is a cross-sectional view of FIG. 1, FIG. 4A is a partial enlarged view of FIG. 3, and FIG. 4B is cross-sectional view of a second embodiment of a supporting base being installed on a back plate by a coupling element. The supporting base 210 has a first surface 212 and a second surface 213; the first surface 212 is a side of the supporting base 210 which is closed to the fan blade 230, while the second surface 213 is a side of the supporting base 210 which is closed to the back plate 100. The coupling hole 211 penetrates the supporting base 210 from the first surface 212 to the second surface 213, and the coupling hole 211 has a recess 216 disposed on the first surface 212, the recess 216 for example, can be shaped as a cylindrical shape as shown in FIG. 4A. Therefore, when the supporting base 210 is installed on the back plate 100 by the coupling element 300, the coupling element 300 is submerged in the recess 216. In other words, a distance from a top of the coupling element 300 to the second surface 213 is smaller or equal to that from the first surface 212 to the second surface 213, so that a flow of the forced air current is not affected by the coupling element 300.

However, in other embodiments, the recess 216 can also be in other shapes besides the cylindrical shape, such as in a conical shape. Referring to FIG. 4B, an inclined surface 217 is disposed surrounding the recess 216 on the supporting base 210, so that a cross-sectional area of a top end of the recess 216 is larger than that of a bottom end of the recess 216. The coupling element 300 has a slant surface 310 matching the inclined surface 217, so that when the fan 200 is installed on the back plate 100 by the coupling element 300, the slant surface 310 of the coupling element 300 is overlapped on the inclined surface 217. The distance from the top of the coupling element 300 to the second surface 213 is smaller or equal to that from the first surface 212 to the second surface 213. If the distance from the top of the coupling element 300 to the second surface 213 is equal to that from the first surface 212 to the second surface 213, the coupling element 300 is exactly filled in spaces of the coupling holes 211 and the recess 216, so that the top of the coupling element 300 and the first surface 212 of the supporting base 210 together form a plane surface. Therefore, an airflow field before and after disposing the coupling hole 211 is similar, and an airflow field of the forced air current is not affected.

Furthermore, the first surface 212 does not have to have the recess 216 disposed at where the coupling hole 211 is, as long as a rotation of the fan blade 230 is not interfered by the coupling element 300 when the fan blade 230 is under operation, but not as a limitation thereof.

Figure 5:
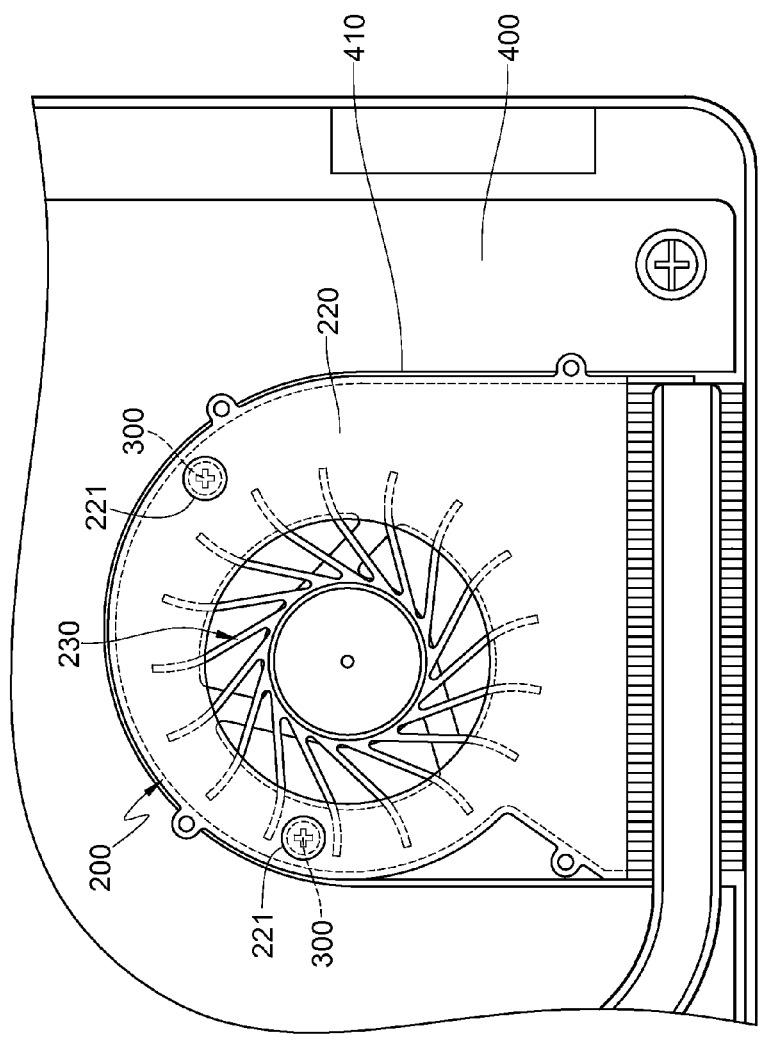
FIG. 5 is a partial top view of FIG. 1.

Furthermore, FIG. 5 is a partial top view of FIG. 1. Provided that the fan blade 230 and the coupling element 300 do not interfered with each other, the coupling hole 211 can be disposed within a turning area of the fan blade 230, or outside the turning area of the fan blade 230 as shown in FIG. 5, but not as limitations thereof.

Figure 6:
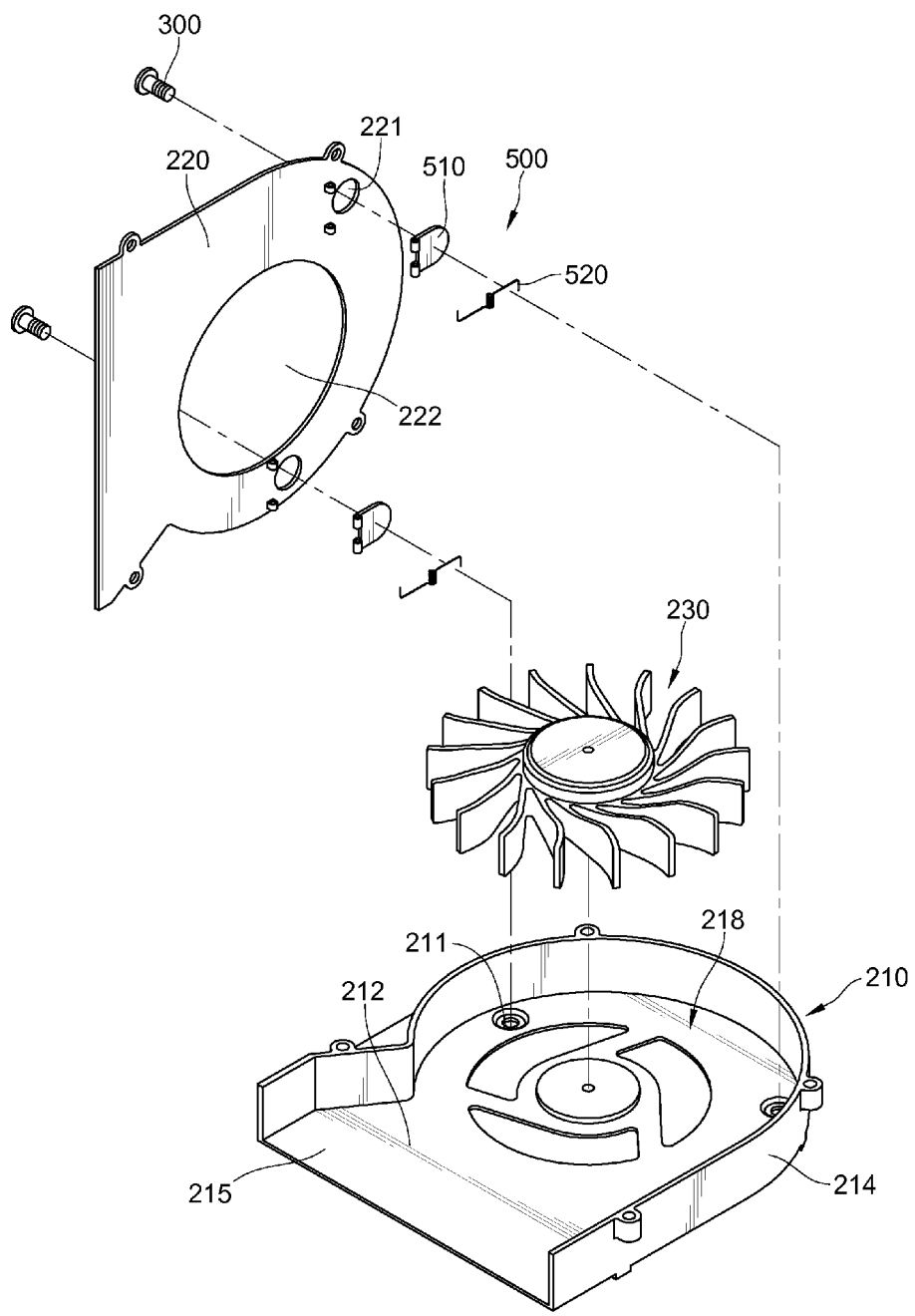
FIG. 6 is an exploded perspective view of a fan structure of FIG. 1.

Referring to FIG. 6, which is an exploded perspective view of a fan structure of FIG. 1. In this embodiment, the cover 220 can include an opening 221 disposed right above the coupling hole 211 for convenience of assembling staff to disassemble the fan 200.

However, although the opening 221 on the cover 220 allows convenience of assembling by staff, an airflow field after and before disposing the opening 221 on the cover 220 is different, therefore the cover 220 can include a covering element 500. The covering element 500 can be a thin piece disposed above the opening 221 to close the opening 221. The covering element 500 can be removed to expose the opening 221 when it is needed to assemble the fan 200. As shown in FIG. 6, the covering element 500 includes a cover board 510 and an elastic element 520, the cover board 510 is pivotally connected to the cover 220, an end of the elastic element 520 is connected to the cover 220, while its another end is connected to the cover board 510, and the opening 221 is normally covered by the cover board 510.

In the following, a way the fan 200 is assembled on the back plate 100 is described by using a structure of the covering element 500 of the fan 200 shown in FIG. 6. Please refer to FIGS. 7A to 7C which are illustrations of assembling a fan on a back plate of FIG. 1.

Figure 7A:
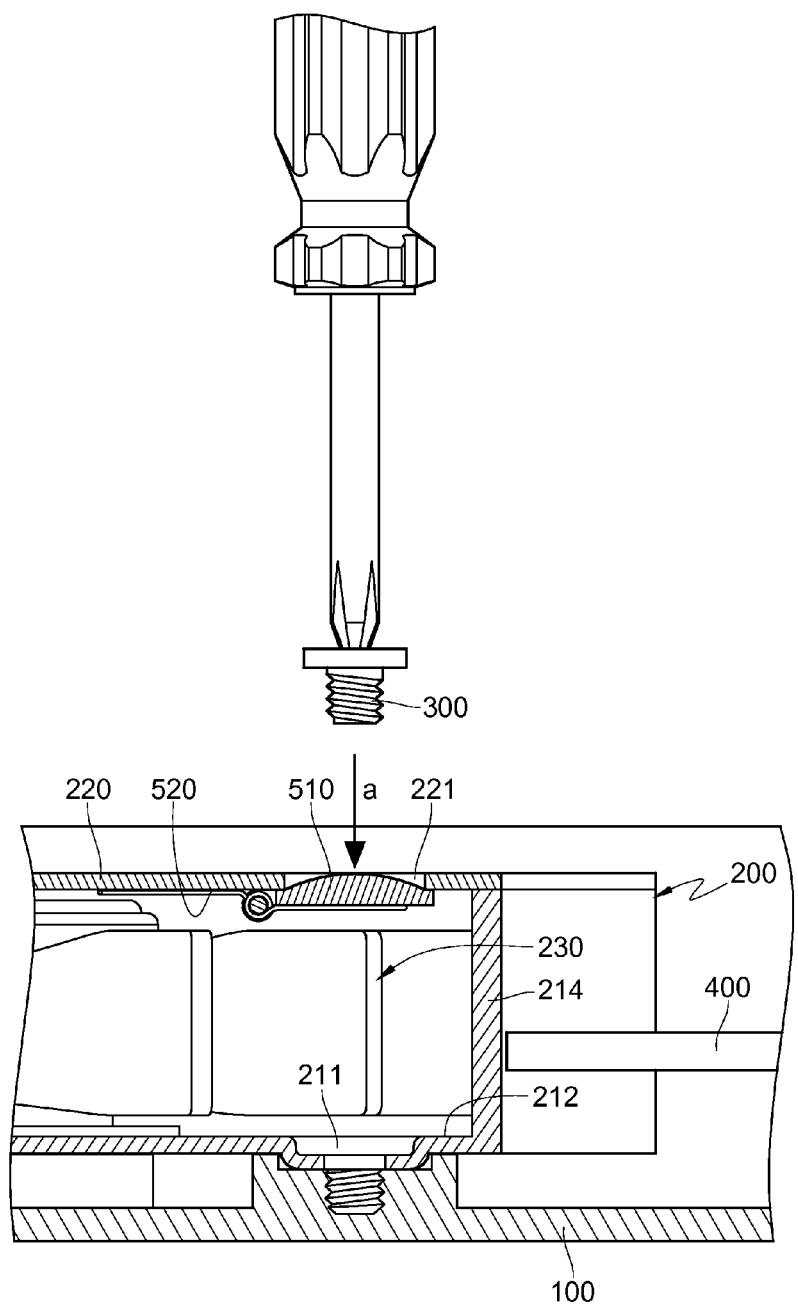
FIGS. 7A to 7C are illustrations of assembling a fan on a back plate of FIG. 1.
Figure 7B:
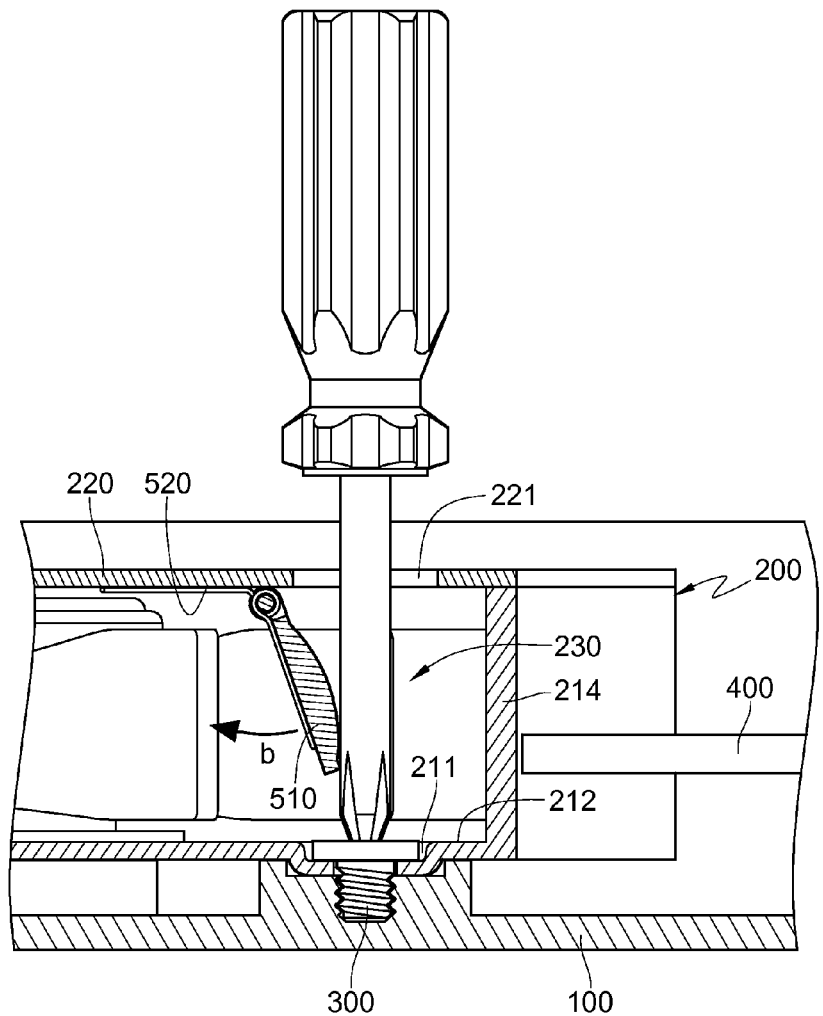
Figure 7C:
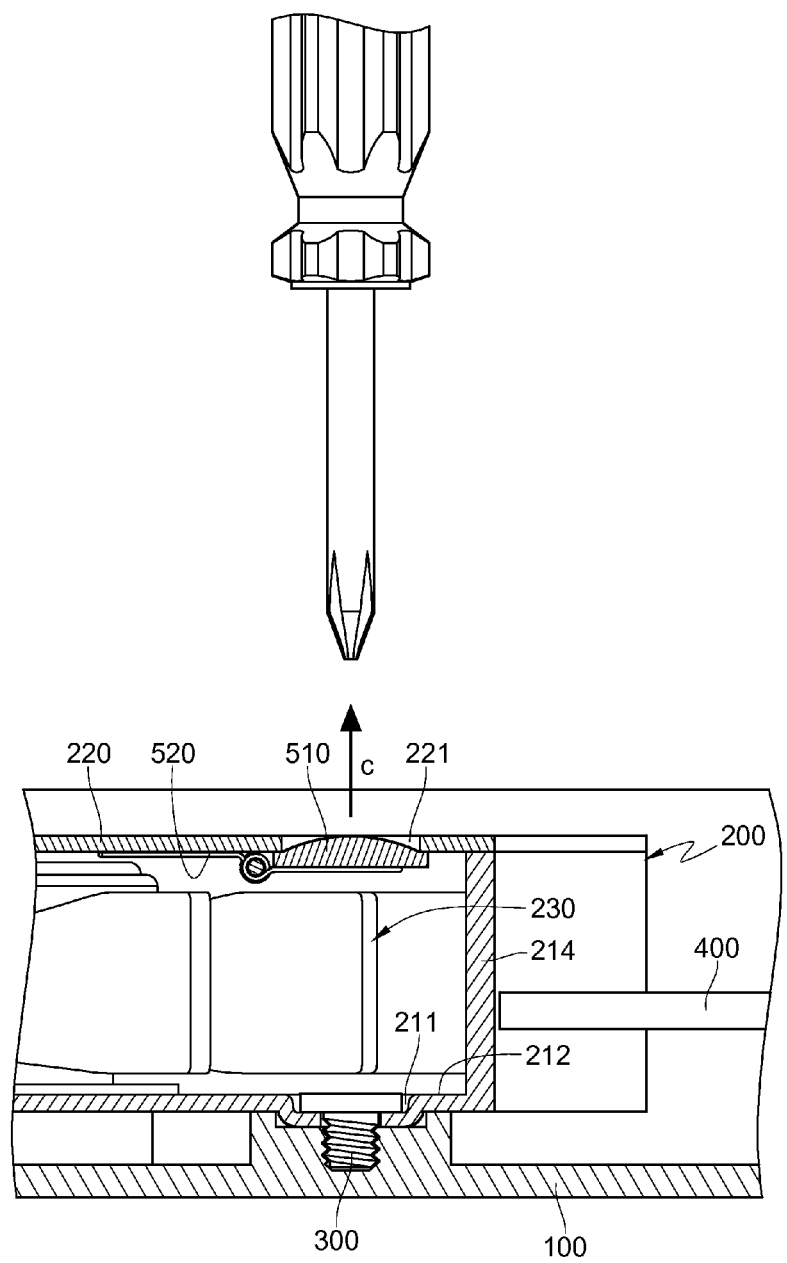

Firstly, as show in FIG. 7A, the cover board 510 is retained by the elastic element 520 to be covered on the opening 221 normally. The coupling element 300 is then moved to where the coupling hole 211 is in a direction a as shown in FIGS. 7A and 7B, the cover board 510 is pressed against by the coupling element 300 and an external tool and moved in a direction b to expose the opening 221. Then, after the coupling element 300 is locked in the coupling hole 211 by the external tool, remove the tool in a direction c, and the cover board 510 is bounced back by the elastic element 520 to close the opening 221 again.

The electronic device disclosed in the abovementioned embodiment, with a disposing position of the coupling hole being moved inside an area surrounded by the surrounding wall instead of locating outside the area surrounded by the surrounding wall. Therefore, a bottom area of the fan can be reduced effectively, so that the space required for assembling the fan is reduced, without having the space of circuit layout for the circuit board occupied.

Furthermore, in order to solve a problem that an airflow field of the fan will be affected by possible unevenness of the first surface because the coupling hole is moved inside the area surrounded by the surrounding wall; therefore the recess is disposed on the first surface at where the coupling hole is located, so that after the fan is locked on the back plate by the coupling element, the distance from the top of the coupling element to the second surface is smaller or equal to that from the first surface to the second surface. As a result, after the fan is assembled on the electronic device by the coupling element, the first surface can be filled flatly and thus the airflow field of the fan will not be affected.

In addition, the cover further includes the opening, and therefore the coupling element can be locked directly in the coupling hole by an external tool operated above the fan, without having to detach the cover from the supporting base first in order to have the coupling element locked by assembling staff.

What is claimed is:

1. An electronic device comprising:
   a back plate;
   a fan disposed on the back plate, comprising:
   a supporting base including a coupling hole, a first surface and a surrounding wall erected on the first surface, the coupling hole is disposed on the first surface and is surrounded by the surrounding wall;
   a cover disposed on the surrounding wall, the supporting base and the cover together form a fan blade accommodating space;
   a fan blade pivotally connected to the supporting base and disposed inside the fan blade accommodating space; and
   a coupling element passing through the coupling hole so that the supporting base is installed on the back plate, wherein the supporting base has a second surface corresponding to the first surface, the coupling hole penetrating through the first surface and second surface, the coupling hole having a recess disposed on the first surface, a distance from the coupling element to the second surface is smaller than a distance from the first surface to the second surface.

2. The electronic device as claimed in claim 1, wherein an inclined surface is disposed surrounding the recess on the supporting base, so that a cross-sectional area of a top end of the recess is larger than a cross-sectional area of a bottom end of the recess, the coupling element has a slant surface in corresponding to the inclined surface.

3. The electronic device as claimed in claim 1, wherein the cover has an opening disposed right above the coupling hole so that the coupling hole is exposed.

4. The electronic device as claimed in claim 3, further including a covering element disposed on the cover to close or expose the opening.

5. The electronic device as claimed in claim 4, wherein the covering element includes a cover board and an elastic element, the cover board is pivotally connected to the cover, an end of the elastic element is connected to the cover, while its another end is connected to the cover board, so that the opening is normally covered by the cover board.

6. A fan structure applicable to be disposed on a back plate by a coupling element, comprising:
   a supporting base including a coupling hole, a first surface and a surrounding wall erected on the first surface, the coupling hole being disposed on the first surface and surrounded by the surrounding wall, and the coupling element passing through the coupling hole in order to have the supporting base installed on the back plate;
   a cover disposed on the surrounding wall, the supporting base and the cover together form a fan blade accommodating space; and
   a fan blade pivotally connected to the supporting base and disposed inside the fan blade accommodating space, wherein the supporting base has a second surface corresponding to the first surface, the coupling hole penetrating through the first surface and second surface, the coupling hole having a recess disposed on the first surface, a distance from the coupling element to the second surface is smaller than a distance from the first surface to the second surface.

7. The fan structure as claimed in claim 6, wherein the cover has an opening disposed right above the coupling hole so that the coupling hole is exposed.

8. The fan structure as claimed in claim 7, further including a covering element disposed on the cover to close or expose the opening.

9. The fan structure as claimed in claim 8, wherein the covering element includes a cover board and an elastic element, the cover board is pivotally connected to the cover, an end of the elastic element is connected to the cover, while its another end is connected to the cover board, so that the opening is normally covered by the cover board.

* * * * *